(12) United States Patent
Nakamura

(10) Patent No.: US 7,982,515 B2
(45) Date of Patent: Jul. 19, 2011

(54) LATCH CIRCUIT TOLERANT TO SINGLE EVENT TRANSIENT

(75) Inventor: Hideyuki Nakamura, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 11/802,179

(22) Filed: May 21, 2007

(65) Prior Publication Data

US 2007/0268056 A1 Nov. 22, 2007

(30) Foreign Application Priority Data

May 22, 2006 (JP) ................................ 2006-141304

(51) Int. Cl.
*H03K 3/356* (2006.01)
(52) U.S. Cl. ........ 327/213; 327/208; 327/210; 327/212; 327/218
(58) Field of Classification Search .......... 327/202–203, 327/208, 210–213, 218
See application file for complete search history.

(56) References Cited

U.S. PATENT DOCUMENTS

| | | | | |
|---|---|---|---|---|
| 5,504,703 A | * | 4/1996 | Bansal | 365/156 |
| 5,754,070 A | * | 5/1998 | Baumann et al. | 327/198 |
| 6,198,323 B1 | * | 3/2001 | Offord | 327/202 |
| 6,327,176 B1 | * | 12/2001 | Li et al. | 365/156 |
| 6,696,873 B2 | | 2/2004 | Hazucha et al. | |
| 7,212,056 B1 | * | 5/2007 | Belov | 327/210 |
| 7,221,205 B2 | * | 5/2007 | Kinkade et al. | 327/203 |
| 7,260,001 B2 | * | 8/2007 | Bull | 365/189.07 |

OTHER PUBLICATIONS

T. Calin, et al., "Upset Hardened Memory Design for Submicron CMOS Technology", IEEE Transactions on Nuclear Science, vol. 43, No. 6, pp. 2874-5878, Dec. 1996.
P. Hazucha, et al. "Measurement and analysis of SER tolerant latch in a 90 nm dual-Vt CMOS process", IWWW 2003 Custom Integrated Circuits Conference, pp. 917-620, 2003.
M. J. Myjak, et al., "Enhanced Fault-Tolerant CMOS Memory Elements", The 47th IEEE International Midwest Symposium on Circuits and Systems, pp. 1-453-456, 2004.

* cited by examiner

*Primary Examiner* — Long Nguyen
(74) *Attorney, Agent, or Firm* — McGinn IP Law Group, PLLC

(57) ABSTRACT

A latch circuit has: a data input unit to which an input data is input; and a data retention unit including a node connected to the data input unit. The data input unit transmits a data depending on the input data to the node, when both of a first clock signal and a second clock signal that are driven independently from each other are at a first level. The data retention unit holds a data at the node, when at least one of the first clock signal and the second clock signal is at a second level that is an inverted level of the first level.

10 Claims, 14 Drawing Sheets

LATCH CIRCUIT TOLERANT TO SINGLE EVENT TRANSIENT

BACKGROUND OF THE INVENTION

1. Field of the Invention

The present invention relates to a latch circuit in a semiconductor integrated circuit.

2. Description of Related Art

High-energy radiation incident on a semiconductor chip induces errors and malfunction of various circuits. For example, the incident radiation can cause a phenomenon that a data (bit) stored on a node of a memory element is flipped. Such a phenomenon of the bit flip is called an "SEU (Single Event Upset)".

A memory element such as an SRAM, a latch circuit or the like whose tolerance to the SEU is enhanced is described in: U.S. Pat. No. 6,696,873; T. Calin, et al., "Upset Hardened Memory Design for Submicron CMOS Technology", IEEE TRANSACTIONS ON NUCLEAR SCIENCE, Vol. 43, No. 6, pp. 2874-2878, December 1996; P. Hazucha, et al., "Measurements and analysis of SER tolerant latch in a 90 nm dual-Vt CMOS process", IEEE 2003 CUSTOM INTEGRATED CIRCUITS CONFERENCE, pp. 617-620, 2003; and M. J. Myjak, et al., "Enhanced Fault-Tolerant CMOS Memory Elements", The 47th IEEE International Midwest Symposium on Circuits and Systems, pp. I-453-456, 2004. According to the techniques described in the above-mentioned documents, the memory element has four nodes and data are held at the four nodes. More specifically, data of the same value are held at two of the four nodes, while the inverted data are held at the other two nodes. That is, the data at the four nodes during a stable state are represented by [0, 1, 0, 1] or [1, 0, 1, 0]. In order to flip the data hold state, it is necessary to change the data at two or more nodes simultaneously. Even if the data at any one node is changed transiently for a short time period of the SEU, the data at the other three nodes are maintained. As a result, the data hold state of the four nodes returns back to the original stable state. In this manner, the SEU tolerance of the memory element is enhanced.

The inventor of the present application has recognized the following points. The radiation incident on a semiconductor chip can cause not only the bit flip in the memory element but also disturbance of an output signal level in a combination logic circuit. Such a radiation-induced disturbance of the signal level is called an "SET (Single Event Transient)". The SET causes errors and malfunction of a semiconductor integrated circuit. For example, if the disturbance occurs in a clock signal supplied to a latch circuit, malfunction of the latch circuit can occur. In that case, the malfunction of the latch circuit results in a change (rewrite) of the stored data, even if no SEU occurs. A technique that can enhance tolerance of the latch circuit to the SET of the clock signal is desired.

SUMMARY

In one embodiment of the present invention, a latch circuit comprises: a data input unit to which an input data is input; and a data retention unit including a node connected to the data input unit. When both of a first clock signal and a second clock signal that are driven independently from each other are at a first level, the data input unit transmits a data depending on the input data to the above-mentioned node. When at least one of the first clock signal and the second clock signal is at a second level that is an inverted level of the first level, the data retention unit holds a data at the above-mentioned node.

In this manner, an operation of the latch circuit thus constructed is controlled by the two independent clock signal lines. Even if one clock signal line varies transiently due to the SET, the input data is not reflected in a data at the node in the data retention unit. Moreover, even if one clock signal line varies transiently, the data retention unit keeps holding the data at the node. Therefore, the malfunction of the latch circuit due to the clock disturbance caused by the SET and the rewrite of the stored data can be prevented. That is to say, the tolerance of the latch circuit to the SET of the clock signal is improved.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A latch circuit according to the embodiments is included in a flip-flop circuit, for example. A latch circuit according to the embodiments may be included in a semiconductor integrated circuit and used for latching data.

1. First Embodiment

1-1. Schematic Configuration

Figure 1:
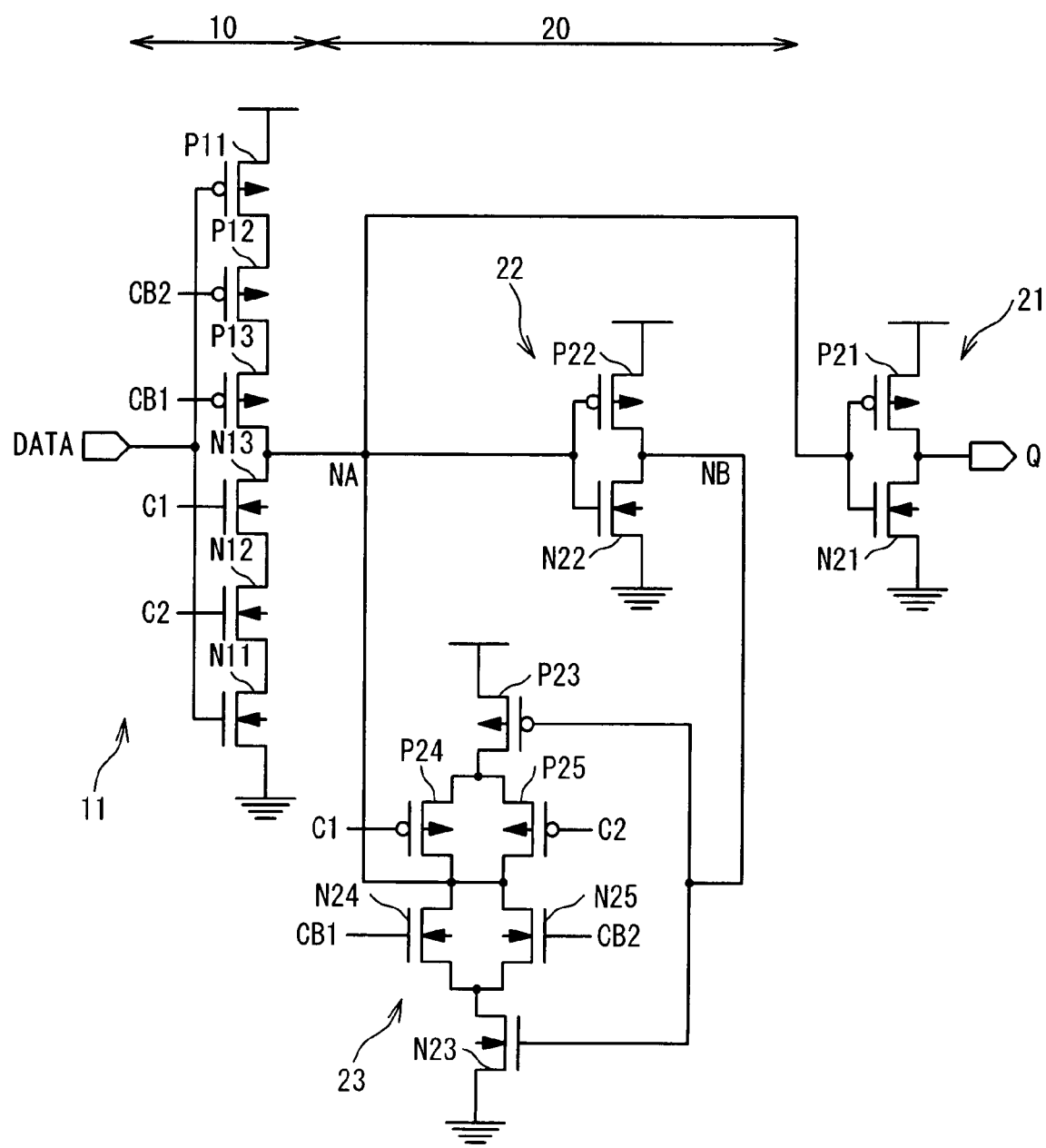
FIG. 1 is a circuit diagram showing a latch circuit according to a first embodiment of the present invention.

FIG. 1 is a circuit diagram showing a configuration of a latch circuit according to the first embodiment of the present invention. The latch circuit is provided with: an input terminal DATA to which an input data is input; a data input unit 10; a data retention unit 20; and an output terminal Q from which an output data is output. The input terminal DATA is connected to the data input unit 10, and the input data is input through the input terminal DATA to the data input unit 10. The data input unit 10 is connected to a node NA in the data retention unit 20 and transmits a data depending on the input data to the node NA. The data retention unit 20 holds a data at the node NA. The node NA is connected to the output terminal Q through an inverter 21 that consists of a Pch-transistor P21 and an Nch-transistor N21.

The latch circuit according to the present embodiment is controlled by clock signals of two lines. One line (a first clock signal) includes a first normal clock signal C1 and a first inverted clock signal CB1 that is an inverted signal of the first normal clock signal C1. The other line (a second clock signal) includes a second normal clock signal C2 and a second inverted clock signal CB2 that is an inverted signal of the second normal clock signal C2. Although transitions of the clock signals C1, CB1, C2 and CB2 occur simultaneously in synchronization with each other, the clock signals C1, CB1, C2 and CB2 are driven independently of each other. Moreover, a phase of the first normal clock signal C1 is equal to that of the second normal clock signal C2, and a phase of the first inverted clock signal CB1 is equal to that of the second inverted clock signal CB2. That is to say, the two clock signal lines (C1, CB1) and (C2, CB2) are in the same state, unless a disturbance occurs. In other words, redundant clock signals are supplied to the latch circuits according to the present embodiment.

Operations of the data input unit 10 and the data retention unit 20 are controlled by the redundant clock signals. The data input unit 10 transfers the data to the node NA or blocks the data transfer, depending on the states of the two clock signal lines (C1, CB1) and (C2, CB2). The data retention unit 20 holds the data at the node NA or stops holding the data, depending on the states of the two clock signal lines (C1, CB1) and (C2, CB2). Configuration examples of the data input unit 10 and the data retention unit 20 will be described below in detail.

1-2. Data Input Unit

In FIG. 1, the data input unit 10 includes a clocked inverter 11 connected between the input terminal DATA and the node NA. The clocked inverter 11 is composed of six MOS transistors that are connected in series between a power source and a ground. More specifically, the clocked inverter 11 has Pch-transistors P11 to P13 and Nch-transistors N11 to N13 that are connected in series.

Gates of the Pch-transistor P11 and the Nch-transistor N11 are connected to the input terminal DATA. Drains of the Pch-transistor P13 and the Nch-transistor N13 are connected to the node NA. The second inverted clock signal CB2 is input to a gate of the Pch-transistor P12. The first inverted clock signal CB1 is input to a gate of the Pch-transistor P13. The first normal clock signal C1 is input to a gate of the Nch-transistor N13. The second inverted clock signal CB2 is input to a gate of the Nch-transistor N12. That is, the clocked inverter 11 is configured to operate on the basis of the two clock signal lines (C1, CB1) and (C2, CB2).

More specifically, in a case when both of the first normal clock signal C1 and the second normal clock signal C2 are at a High level (first state), both of the Nch-transistors N13 and N12 are turned on. At the same time, both of the first inverted clock signal CB1 and the second inverted clock signal CB2 become at a Low level, and thus both of the Pch-transistors P13 and P12 are turned on. As a result, the clocked inverter 11 functions as a simple inverter that is composed of the Pch-transistor P11 and the Nch-transistor N11. In this case, the data input unit 10 transmits an inverted data of the input data input to the input terminal DATA to the node NA.

In the other case, namely, in a case when at least one of the first normal clock signal C1 and the second normal clock signal C2 is at the Low level (second state), at least one of the Nch-transistors N13 and N12 is turned off. At the same time, at least one of the first inverted clock signal CB1 and the second inverted clock signal CB2 becomes at the High level, and thus at least one of the Pch-transistors P13 and P12 is turned off. As a result, an electrical connection between the input terminal DATA and the node NA is cut off. That is to say, the data input unit 10 does not transfer the data to the node NA.

1-3. Data Retention Unit

In FIG. 1, the data retention unit 20 includes an inverter 22 and a clocked inverter 23.

The inverter 22 is composed of a Pch-transistor P22 and an Nch-transistor N22. An input of the inverter 22 is connected to the node NA, and its output is connected to a node NB. Consequently, an inverted data of the data at the node NA appears at the node NB. Also, an input of the clocked inverter 23 is connected to the node NB, and its output is connected to the node NA. Thus, the inverter 22 and the clocked inverter 23 form a feedback loop for holding the data.

The clocked inverter 23 includes Pch-transistors P23 to P25 and Nch-transistors N23 to N25. A source of the Pch-transistor P23 is connected to the power source. The Pch-transistors P24 and P25 are connected in parallel between a drain of the Pch-transistor P23 and the node NA. Also, a source of the Nch-transistor N23 is connected to the ground. The Nch-transistors N24 and N25 are connected in parallel between a drain of the Nch-transistor N23 and the node NA.

Gates of the Pch-transistor P23 and the Nch-transistor N23 are connected to the node NB. The first normal clock signal C1 is input to a gate of the Pch-transistor P24. The second normal clock signal C2 is input to a gate of the Pch-transistor P25. The first inverted clock signal CB1 is input to a gate of the Nch-transistor N24. The second inverted clock signal CB2 is input to a gate of the Nch-transistor N25. That is, the clocked inverter 23 is configured to operate on the basis of the two clock signal lines (C1, CB1) and (C2, CB2).

More specifically, in a case when both of the first normal clock signal C1 and the second normal clock signal C2 are at the High level (the first state), both of the Pch-transistors P24 and P25 are turned off. At the same time, both of the first inverted clock signal CB1 and the second inverted clock signal CB2 become at the Low level, and thus both of the Nch-transistors N24 and N25 are turned off. As a result, the feedback from the node NB to the node NA is disabled. Moreover, at this time, the data input unit 10 transmits the inverted data of the input data to the node NA, as mentioned above. Therefore, the data at the node NA is rewritten.

In the other case, namely, in a case when at least one of the first normal clock signal C1 and the second normal clock signal C2 is at the Low level (the second state), at least one of the Pch-transistors P24 and P25 is turned on. At the same time, at least one of the first inverted clock signal CB1 and the second inverted clock signal CB2 becomes at the High level, and thus at least one of the Nch-transistors N24 and N25 is turned on. As a result, the clocked inverter 23 functions as a simple inverter that is composed of the Pch-transistor P23 and the Nch-transistor N23. In this case, the data retention unit 20 stably holds the data at the node NA and the node NB. It should be noted that the data input unit 10 does not transfer the data to the node NA, as mentioned above.

1-4. Effect

As described above, the latch circuit according to the present embodiment is controlled by the two clock signal lines independent of each other. In the case when at least one of the first normal clock signal C1 and the second normal clock signal C2 is at the Low level (the second state), the data input unit 10 does not transfer a data to the node NA and the data retention unit 20 keeps stably holding a data at the node NA. That is to say, even if one clock signal line varies transiently due to the SET, the input data is not reflected in a data at the node NA and a data at the node NA is held stably. Therefore, the malfunction of the latch circuit due to the clock disturbance caused by the SET and the rewrite of the stored data can be prevented. In other words, the tolerance of the latch circuit to the SET of the clock signal is improved.

In the case when both of the first normal clock signal C1 and the second normal clock signal C2 are at the High level (the first state), the data at the node NA is rewritten. At this time, the data input unit 10 transmits the data to the node NA. Simultaneously, the feedback in the data retention unit 20 is disabled, because the data retention unit 20 is also controlled by the two clock signal lines. Since the data retention unit 20 stops holding the data, the data can be rewritten even if the current drive ability of the input side is low. In this manner, since the data retention unit 20 is also controlled by the two clock signal lines, the data rewriting becomes easy and thus data write time can be reduced.

2. Second Embodiment

Figure 2:
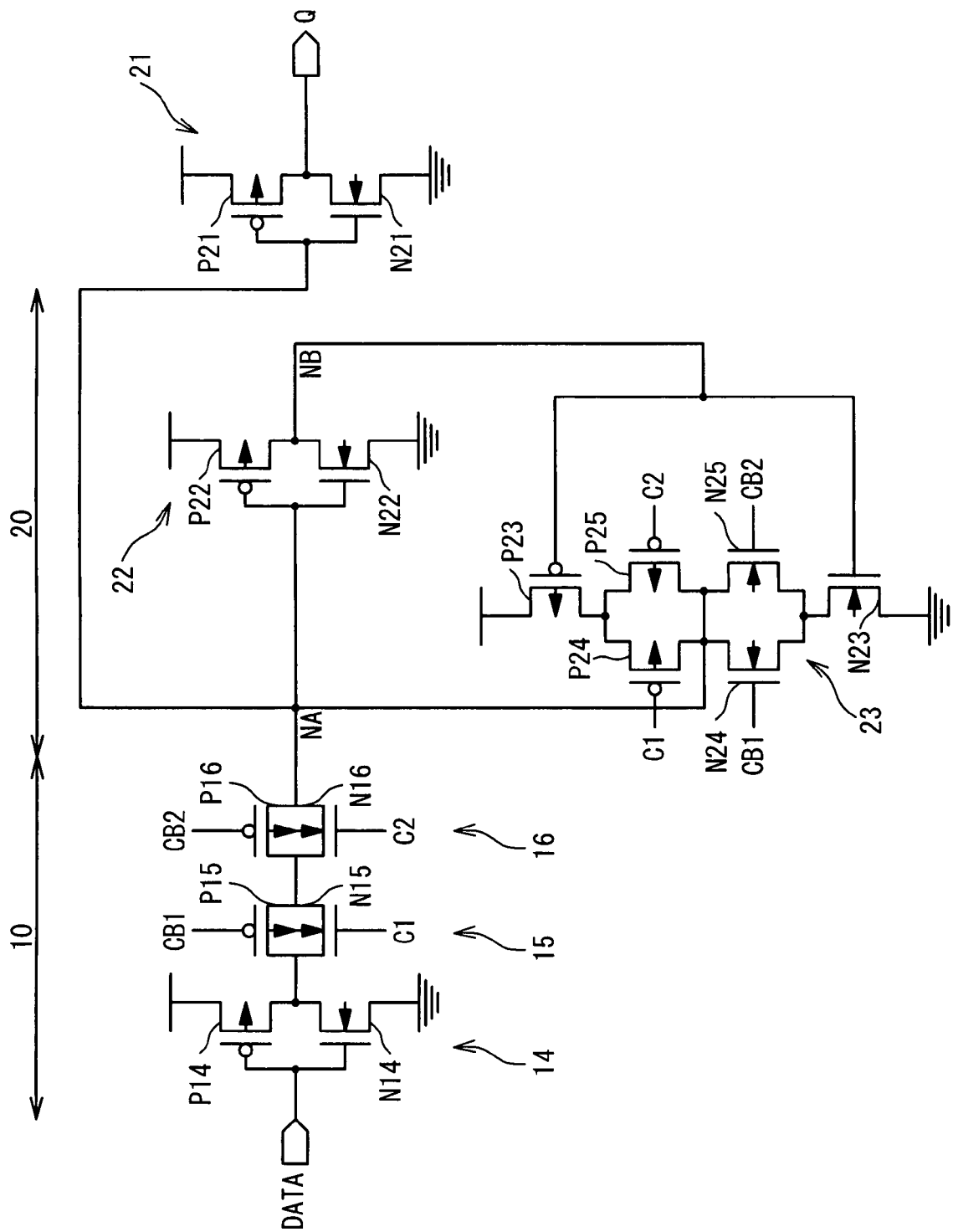
FIG. 2 is a circuit diagram showing a latch circuit according to a second embodiment of the present invention.

FIG. 2 is a circuit diagram showing a configuration of a latch circuit according to the second embodiment of the present invention. In FIG. 2, the same reference numerals are given to the same components as those in FIG. 1, and an overlapping description will be appropriately omitted. The data retention unit 20 in the present embodiment is the same as the data retention unit 20 in the first embodiment.

In FIG. 2, the data input unit 10 includes an inverter 14 and transfer gates 15 and 16. The inverter 14 is composed of a Pch-transistor P14 and an Nch-transistor N14. An input of the inverter 14 is connected to the input terminal DATA. The transfer gates 15 and 16 are connected in series between an output of the inverter 14 and the node NA.

The transfer gate 15 is provided between the output of the inverter 14 and the transfer gate 16. The transfer gate 15 is composed of a Pch-transistor P15 and an Nch-transistor N15. The first inverted clock signal CB1 is input to a gate of the Pch-transistor P15. The first normal clock signal C1 is input to a gate of the Nch-transistor N15. In this manner, the transfer gate 15 is configured to operate on the basis of one clock signal line C1, CB1, The transfer gate 16 is provided between the transfer gate 15 and the node NA. The transfer gate 16 is composed of a Pch-transistor P16 and an Nch-transistor N16. The second inverted clock signal CB2 is input to a gate of the Pch-transistor P16. The second normal clock signal C2 is input to a gate of the Nch-transistor N16. In this manner, the transfer gate 16 is configured to operate on the basis of the other clock signal line C2, CB2.

In the case when both of the first normal clock signal C1 and the second normal clock signal C2 are at the High level (the first state), both of the Nch-transistors N15 and N16 are turned on. At the same time, both of the first inverted clock signal CB1 and the second inverted clock signal CB2 become at the Low level, and thus both of the Pch-transistors P15 and P16 are turned on. As a result, both of the transfer gates 15 and 16 transfer the data. In this case, the data input unit 10 transmits the inverted data of the input data input to the input terminal DATA to the node NA.

In the case when at least one of the first normal clock signal C1 and the second normal clock signal C2 is at the Low level (the second state), at least one of the Nch-transistors N15 and N16 is turned off. At the same time, at least one of the first inverted clock signal CB1 and the second inverted clock signal CB2 becomes at the High level, and thus at least one of the Pch-transistors P15 and P16 is turned off. As a result, an electrical connection between the input terminal DATA and the node NA is cut off. That is to say, the data input unit 10 does not transfer the data to the node NA.

The same effects as in the first embodiment can be obtained by the configuration shown in FIG. 2.

3. Third Embodiment

Figure 3:
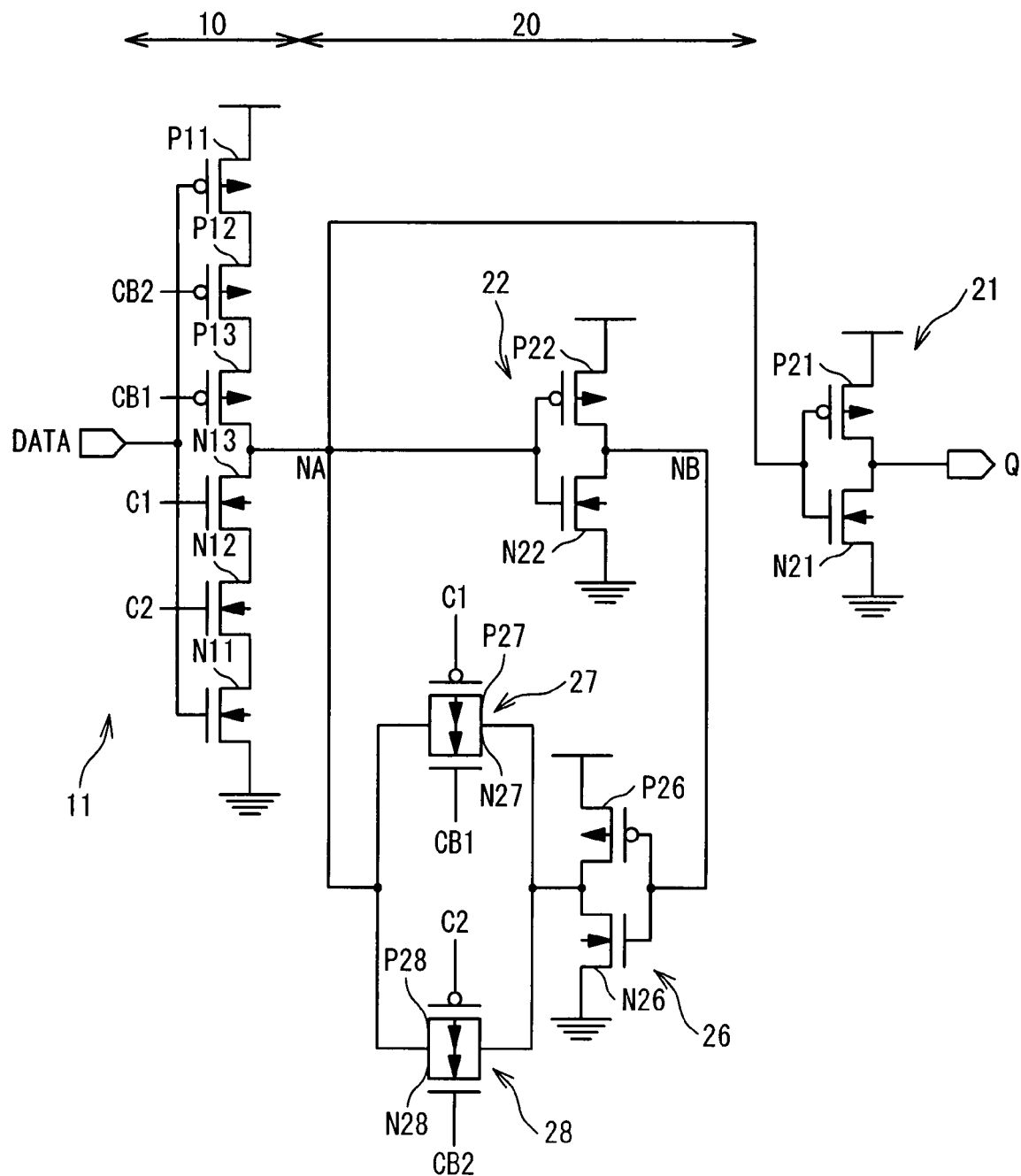
FIG. 3 is a circuit diagram showing a latch circuit according to a third embodiment of the present invention.

FIG. 3 is a circuit diagram showing a configuration of a latch circuit according to the third embodiment of the present invention. In FIG. 3, the same reference numerals are given to the same components as those in FIG. 1, and an overlapping description will be appropriately omitted. The data input unit 10 in the present embodiment is the same as the data input unit 10 in the first embodiment.

In FIG. 3, the data retention unit 20 includes the inverter 22, an inverter 26, transfer gates 27 and 28. The inverter 26 is composed of a Pch-transistor P26 and an Nch-transistor N26. An input of the inverter 26 is connected to the node NB. The transfer gates 27 and 28 are connected in parallel between an output of the inverter 26 and the node NA. In other words, the transfer gates 27 and 28 are provided in parallel on a feedback loop between the inverter 22 and the inverter 26.

The transfer gate 27 is composed of a Pch-transistor P27 and an Nch-transistor N27. The first normal clock signal C1 is input to a gate of the Pch-transistor P27. The first inverted clock signal CB1 is input to a gate of the Nch-transistor N27. In this manner, the transfer gate 27 is configured to operate on the basis of one clock signal line C1, CB1.

The transfer gate 28 is composed of a Pch-transistor P28 and an Nch-transistor N28. The second normal clock signal C2 is input to a gate of the Pch-transistor P28. The second inverted clock signal CB2 is input to a gate of the Nch-transistor N28. In this manner, the transfer gate 28 is configured to operate on the basis of the other clock signal line C2, CB2.

In the case when both of the first normal clock signal C1 and the second normal clock signal C2 are at the High level (the first state), both of the Pch-transistor P27 and the Pch-transistor P28 are turned off. At the same time, both of the first inverted clock signal CB1 and the second inverted clock signal CB2 become at the Low level, and thus both of the Nch-transistor N27 and the Nch-transistor N28 are turned off. As a result, the feedback from the node NB to the node NA is disabled.

In the case when at least one of the first normal clock signal C1 and the second normal clock signal C2 is at the Low level (the second state), at least one of the Pch-transistor P27 and the Pch-transistor P28 is turned on. At the same time, at least one of the first inverted clock signal CB1 and the second inverted clock signal CB2 becomes at the High level, and thus at least one of the Nch-transistors N27 and N28 is turned on. As a result, at least one of the transfer gates 27 and 28 transfers the data. In this case, the data retention unit 20 stably holds the data at the node NA and the node NB.

The same effects as in the first embodiment can be obtained by the configuration shown in FIG. 3.

4. Fourth Embodiment

Figure 4:
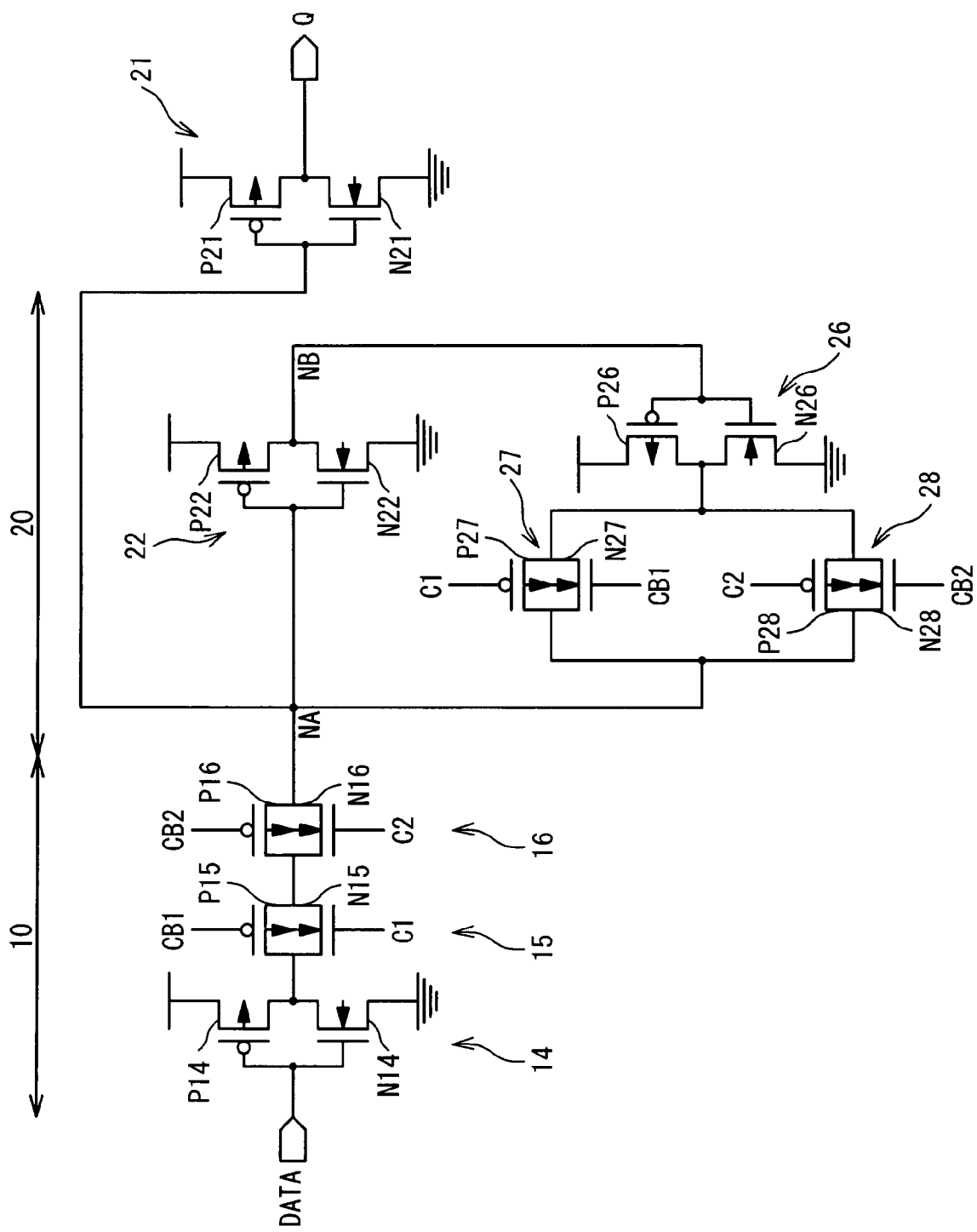
FIG. 4 is a circuit diagram showing a latch circuit according to a fourth embodiment of the present invention.

FIG. 4 is a circuit diagram showing a configuration of a latch circuit according to the fourth embodiment of the present invention. In FIG. 4, the same reference numerals are given to the same components as those in FIGS. 1 to 3, and an overlapping description will be appropriately omitted. The data input unit 10 in the present embodiment is the same as the data input unit 10 in the second embodiment. Moreover, the data retention unit 20 in the present embodiment is the same as the data retention unit 20 in the third embodiment. The same effects as in the first embodiment can be obtained by the configuration shown in FIG. 4.

5. Fifth Embodiment

5-1. Schematic Configuration

Figure 5:
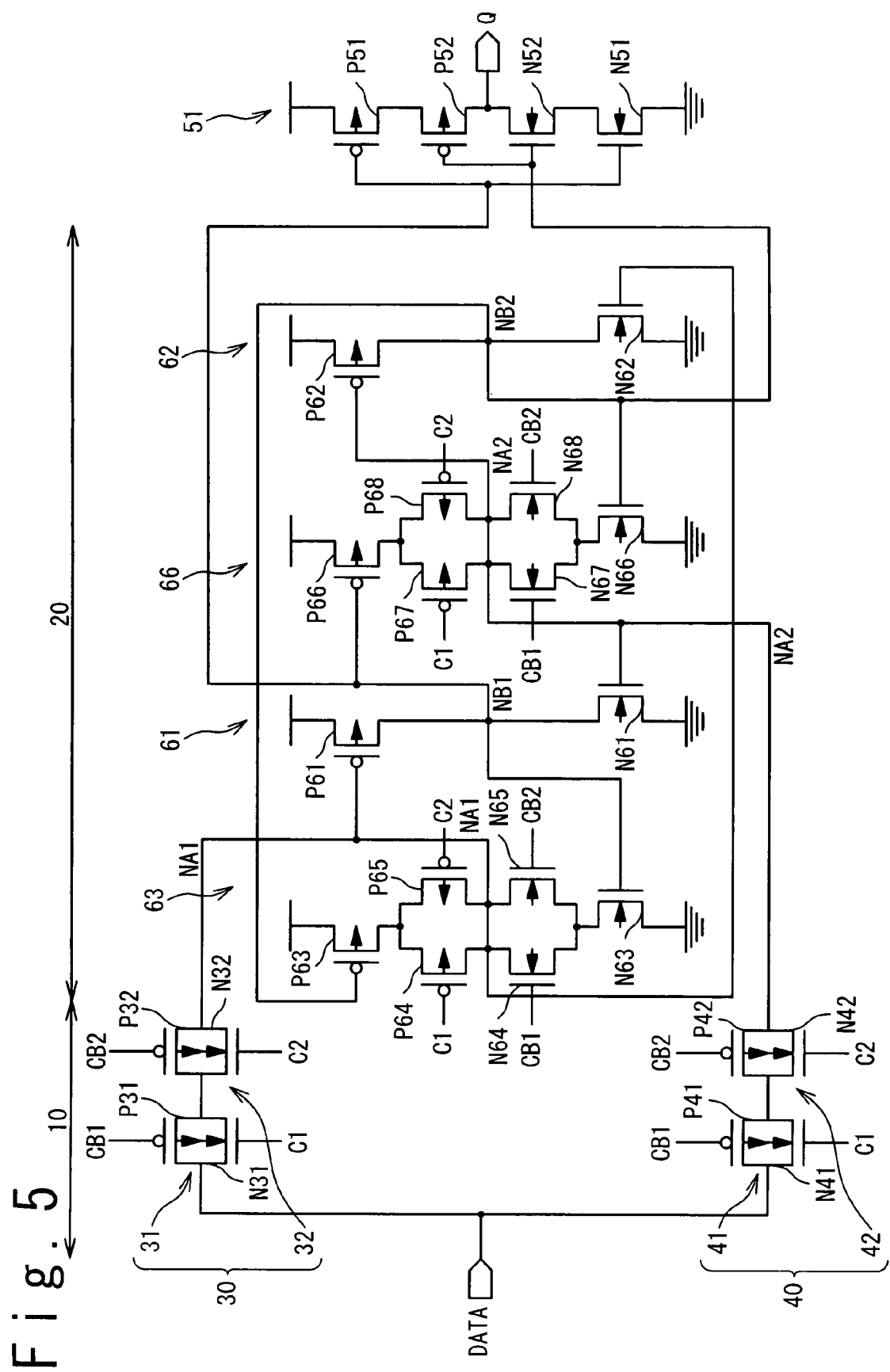
FIG. 5 is a circuit diagram showing a latch circuit according to a fifth embodiment of the present invention.

FIG. 5 is a circuit diagram showing a configuration of a latch circuit according to the fifth embodiment of the present invention. As in the foregoing embodiments, the data retention unit 20 holds the data or stops holding the data, depending on the states of the two clock signal lines (C1, CB1) and (C2, CB2). It should be noted that the data retention unit 20 according to the present embodiment includes four nodes NA1, NA2, NB1 and NB2. The data input unit 10 according to the present embodiment transfers a data to both of the nodes NA1 and NA2 or blocks the data transfer, depending on the states of the two clock signal lines (C1, CB1) and (C2, CB2).

5-2. Data Input Unit

In FIG. 5, the data input unit 10 includes a first data input unit 30 and a second data input unit 40. The first data input unit 30 is connected between the input terminal DATA and the node NA1, and transmits a data depending on an input data supplied to the input terminal DATA to the node NA1. On the other hand, the second data input unit 40 is connected between the input terminal DATA and the node NA2, and transmits a data depending on the input data to the node NA2.

More specifically, the first data input unit 30 includes transfer gates 31 and 32 that are connected in series between the input terminal DATA and the node NA1. The transfer gate 31 is provided between the input terminal DATA and the transfer gate 32, and is composed of a Pch-transistor P31 and an Nch-transistor N31. The first inverted clock signal CB1 is input to a gate of the Pch-transistor P31. The first normal clock signal C1 is input to a gate of the Nch-transistor N31. In this manner, the transfer gate 31 is configured to operate on the basis of one clock signal line C1, CB1. On the other hand, the transfer gate 32 is provided between the transfer gate 31 and the node NA1, and is composed of a Pch-transistor P32 and an Nch-transistor N32. The second inverted clock signal CB2 is input to a gate of the Pch-transistor P32. The second normal clock signal C2 is input to a gate of the Nch-transistor N32. In this manner, the transfer gate 32 is configured to operate on the basis of the other clock signal line C2, CB2.

Similarly, the second data input unit 40 includes transfer gates 41 and 42 that are connected in series between the input terminal DATA and the node NA2. The transfer gate 41 is provided between the input terminal DATA and the transfer gate 42, and is composed of a Pch-transistor P41 and an Nch-transistor N41. The first inverted clock signal CB1 is input to a gate of the Pch-transistor P41. The first normal clock signal C1 is input to a gate of the Nch-transistor N41. In this manner, the transfer gate 41 is configured to operate on the basis of one clock signal line C1, CB1. On the other hand, the transfer gate 42 is provided between the transfer gate 41 and the node NA2, and is composed of a Pch-transistor P42 and an Nch-transistor N42. The second inverted clock signal CB2 is input to a gate of the Pch-transistor P42. The second normal clock signal C2 is input to a gate of the Nch-transistor N42. In this manner, the transfer gate 42 is configured to operate on the basis of the other clock signal line C2, CB2.

In the case when both of the first normal clock signal C1 and the second normal clock signal C2 are at the High level (the first state), both of the Nch-transistors N31 and N32 are turned on. At the same time, both of the first inverted clock signal CB1 and the second inverted clock signal CB2 become at the Low level, and thus both of the Pch-transistors P31 and P32 are turned on. As a result, both of the transfer gates 31 and 32 transfer a data. In this case, the first data input unit 30 transmits the input data input to the input terminal DATA to the node NA1. Similarly, both of the transfer gates 41 and 42 transfer a data. In this case, the second data input unit 40 transmits the input data to the node NA2. That is to say, the data input unit 10 transmits the same data to both of the nodes NA1 and NA2.

In the case when at least one of the first normal clock signal C1 and the second normal clock signal C2 is at the Low level (the second state), at least one of the Nch-transistors N31 and N32 is turned off. At the same time, at least one of the first inverted clock signal CB1 and the second inverted clock signal CB2 becomes at the High level, and thus at least one of the Pch-transistors P31 and P32 is turned off. As a result, an electrical connection between the input terminal DATA and the node NA1 is cut off. In this case, the first data input unit 30 does not transmit the data to the node NA1. Similarly, an electrical connection between the input terminal DATA and the node NA2 is cut off. In this case, the second data input unit 40 does not transmit the data to the node NA2. That is to say, the data input unit 10 does not transmit the data to the nodes NA1 and NA2.

5-3. Data Retention Unit

In FIG. 5, the data retention unit 20 includes the four nodes NA1, NA2, NB1 and NB2. The node NA1 and the node NA2 are connected to the output of the data input unit 10. The node NB1 and the node NB2 are connected to the output terminal Q through an inverter 51.

An inverter 61 is connected between the nodes NA1, NA2 and the node NB1, and hence an inverted data of the data at the nodes NA1, NA2 appears at the node NB1. Also, an inverter 62 is connected between the nodes NA1, NA2 and the node NB2, and hence an inverted data of the data at the nodes NA1, NA2 appears at the node NB2. Moreover, a clocked inverter 63 is connected between the nodes NB1, NB2 and the node NA1, and hence an inverted data of the data at the nodes NB1, NB2 appears at the node NA1. That is, the clocked inverter 63 is provided on a feedback loop from the nodes NB1, NB2 to the node NA1. Furthermore, a clocked inverter 66 is connected between the nodes NB1, NB2 and the node NA2, and hence an inverted data of the data at the nodes NB1, NB2 appears at the node NA2. That is, the clocked inverter 66 is provided on a feedback loop from the nodes NB1, NB2 to the node NA2.

The configurations of respective inverters will be described below in more detail.

The inverter 51 is composed of four MOS transistors that are connected in series between the power source and the ground. More specifically, the inverter 51 includes Pch-transistors P51, P52, Nch-transistors N51 and N52. Gates of the Pch-transistor P51 and the Nch-transistor N51 are connected to the node NB1. Gates of the Pch-transistor P52 and the Nch-transistor N52 are connected to the node NB2. Drains of the Pch-transistor P52 and the Nch-transistor N52 are connected to the output terminal Q. Therefore, if data at the nodes NB1 and NB2 are the same, an inverted data of the data is output from the output terminal Q.

The inverter 61 is composed of a Pch-transistor P61 and an Nch-transistor N61 that are connected in series between the power source and the ground. A gate of the Pch-transistor P61 is connected to the node NA1. A gate of the Nch-transistor N61 is connected to the node NA2. Drains of the Pch-transistor P61 and the Nch-transistor N61 are connected to the node NB1. Therefore, the inverted data of the data at the nodes NA1 and NA2 appears at the node NB1.

The inverter 62 is composed of a Pch-transistor P62 and an Nch-transistor N62 that are connected in series between the power source and the ground. A gate of the Pch-transistor P62 is connected to the node NA2. A gate of the Nch-transistor N62 is connected to the node NA1. Drains of the Pch-transistor P62 and the Nch-transistor N62 are connected to the node NB2. Therefore, the inverted data of the data at the nodes NA1, NA2 appears at the node NB2.

The clocked inverter 63 includes Pch-transistors P63 to P65 and Nch-transistors N63 to N65. A source of the Pch-transistor P63 is connected to the power source. The Pch-transistors P64 and P65 are connected in parallel between a drain of the Pch-transistor P63 and the node NA1. A source of the Nch-transistor N63 is connected to the ground. The Nch-transistors N64 and N65 are connected in parallel between a drain of the Nch-transistor N63 and the node NA1. A gate of the Pch-transistor P63 is connected to the node NB2. A gate of the Nch-transistor N63 is connected to the node NB1. The first normal clock signal C1 is input to a gate of the Pch-transistor P64. The second normal clock signal C2 is input to a gate of the Pch-transistor P65. The first inverted clock signal CB1 is input to a gate of the Nch-transistor N64. The second inverted clock signal CB2 is input to a gate of the Nch-transistor N65. That is to say, the clocked inverter 63 is configured to operate on the basis of the two clock signal lines (C1, CB1) and (C2, CB2).

The clocked inverter 66 includes Pch-transistors P66 to P68 and Nch-transistors N66 to N68. A source of the Pch-transistor P66 is connected to the power source. The Pch-transistors P67 and P68 are connected in parallel between a drain of the Pch-transistor P66 and the node NA2. A source of the Nch-transistor N66 is connected to the ground. The Nch-transistors N67 and N68 are connected in parallel between a drain of the Nch-transistor N66 and the node NA2. A gate of the Pch-transistor P66 is connected to the node NB1. A gate of the Nch-transistor N66 is connected to the node NB2. The first normal clock signal C1 is input to a gate of the Pch-transistor P67. The second normal clock signal C2 is input to a gate of the Pch-transistor P68. The first inverted clock signal CB1 is input to a gate of the Nch-transistor N67. The second inverted clock signal CB2 is input to a gate of the Nch-transistor N68. That is to say, the clocked inverter 66 is configured to operate on the basis of the two clock signal lines (C1, CB1) and (C2, CB2).

In the case when both of the first normal clock signal C1 and the second normal clock signal C2 are at the High level (the first state), both of the Pch-transistors P64 and P65 are turned off. At the same time, both of the first inverted clock signal CB1 and the second inverted clock signal CB2 become at the Low level, and thus both of the Nch-transistors N64 and N65 are turned off. As a result, the clocked inverter 63 is deactivated, and hence the feedback from the nodes NB1, NB2 to the node NA1 is disabled. Similarly, the clocked inverter 66 is deactivated, and hence the feedback from the nodes NB1, NB2 to the node NA2 is disabled. At this time, the data input unit 10 transmits the input data to both of the nodes NA1, NA2, as described above. Therefore, in the data retention unit 20, the data at the nodes NA1 and NA2 are rewritten. The inverters 61 and 62 output the inverted data of the data at the nodes NA1, NA2 to the nodes NB1 and NB2, respectively. Therefore, the data at the nodes NB1 and NB2 are also rewritten. Then, the inverter 51 outputs the inverted data of the data at the nodes NB1 and NB2 to the output terminal Q.

In the case when at least one of the first normal clock signal C1 and the second normal clock signal C2 is at the Low level (the second state), at least one of the Pch-transistors P64 and P65 is turned on. At the same time, at least one of the first inverted clock signal CB1 and the second inverted clock signal CB2 becomes at the High level, and thus at least one of the Nch-transistors N64 and N65 is turned on. As a result, the clocked inverter 63 functions as a simple inverter composed of the Pch-transistor P63 and the Nch-transistor N63. In other words, the clocked inverter 63 is activated, and hence the feedback from the nodes NB1, NB2 to the node NA1 is enabled. Similarly, the clocked inverter 66 is activated, and hence the feedback from the nodes NB1, NB2 to the node NA2 is enabled. In this case, the data retention unit 20 stably holds the data at the four nodes NA1, NA2, NB1 and NB2. More specifically, data of the same value are held at two of the four nodes, while the inverted data are held at the other two nodes. That is, the data at the four nodes during a stable state are represented by [0, 1, 0, 1] or [1, 0, 1, 0]. The inverter 51 outputs the inverted data of the data at the nodes NB1 and NB2 to the output terminal Q. It should be noted that the data input unit 10 does not transmit the data to the node NA, as mentioned above.

5-4. Effect

According to the present embodiment, the tolerance of the latch circuit to the SET of the clock signal is improved, as in the foregoing embodiments. Furthermore, an additional effect that tolerance of the latch circuit to the SEU (Single Event Upset) is improved can be obtained. The reason is as follows.

According to the data retention unit 20 of the present embodiment, as described above, the data are held at the four nodes NA1, NA2, NB1 and NB2. The data at the four nodes during the stable state are [0, 1, 0, 1] or [1, 0, 1, 0]. In order to flip the data hold state, it is necessary to change the data at two or more nodes simultaneously. Even if the data at any one node is changed transiently for a short time period of the SEU, the data at the other three nodes are maintained. As a result, the data hold state of the four nodes returns back to the original stable state. In this manner, the SEU tolerance of the latch circuit is enhanced.

In the case when both of the first normal clock signal C1 and the second normal clock signal C2 are at the High level (the first state), the data are rewritten. At this time, the data input unit 10 transmits the data to both of the nodes NA1 and NA2. Simultaneously, the feedback in the data retention unit 20 is disabled, because the data retention unit 20 is also controlled by the two clock signal lines. Since the data retention unit 20 stops holding the data, the data can be rewritten even if the current drive ability of the input side is low. In this manner, since the data retention unit 20 is also controlled by the two clock signal lines, the data rewriting becomes easy and thus data write time can be reduced.

6. Sixth Embodiment

Figure 6:
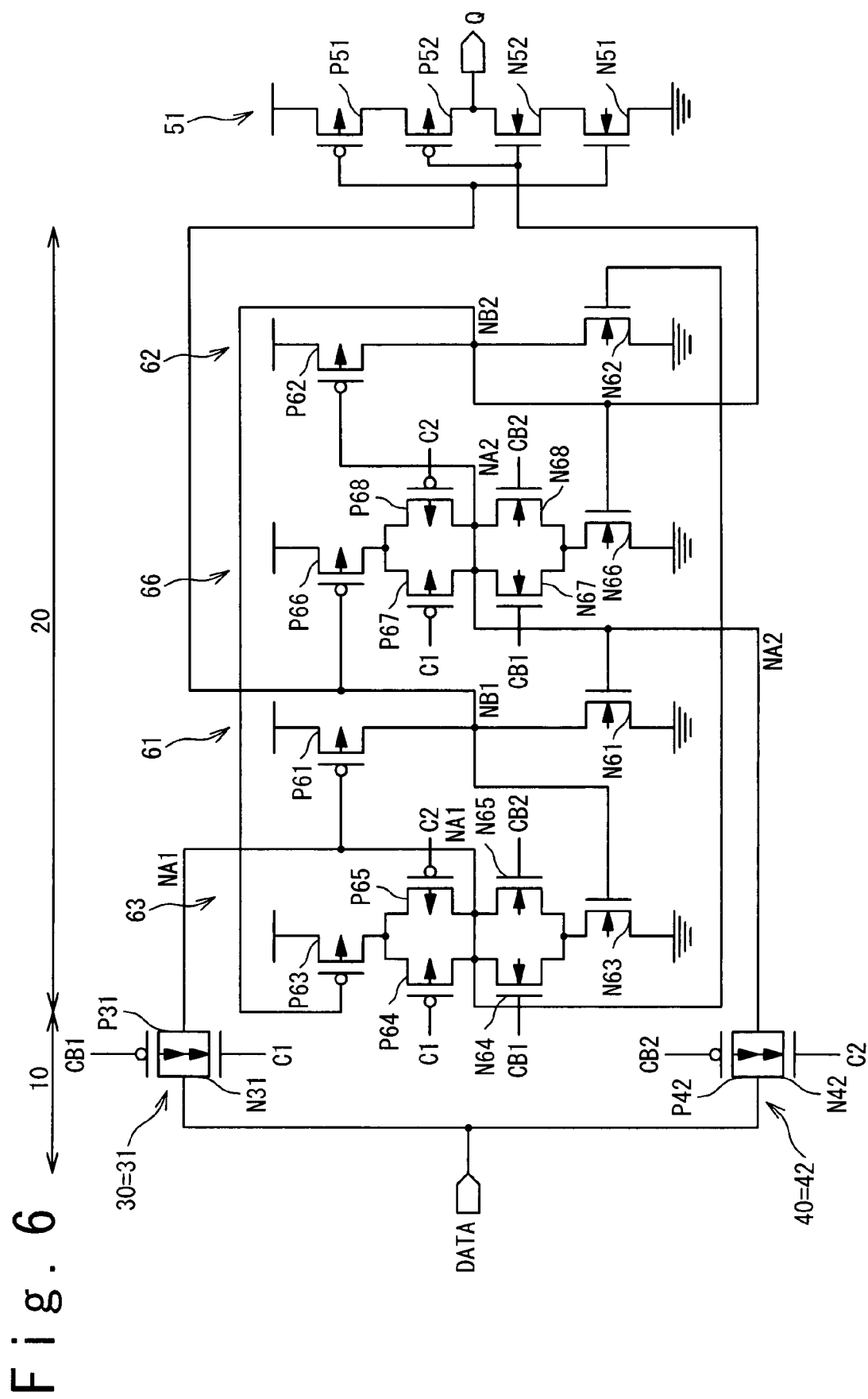
FIG. 6 is a circuit diagram showing a latch circuit according to a sixth embodiment of the present invention.

FIG. 6 is a circuit diagram showing a configuration of a latch circuit according to the sixth embodiment of the present invention. In FIG. 6, the same reference numerals are given to the same components as those in FIG. 5, and an overlapping description will be appropriately omitted. The data retention unit 20 in the present embodiment is the same as the data retention unit 20 in the fifth embodiment.

Since the SEU tolerance is enhanced in the data retention unit 20 as described above, the data input unit 10 needs to supply the same data simultaneously to both of the nodes NA1 and NA2 in order to carry out the data writing. If the data supplied to the respective nodes NA1 and NA2 are not identical to each other, the data writing is not achieved and the data hold state of the four nodes returns back to the original state. By utilizing such the characteristics, the data input unit 10 according to the present embodiment is simplified.

In FIG. 6, the first data input unit 30 has the above-mentioned transfer gate 31, and the transfer gate 32 is omitted. The second data input unit 40 has the above-mentioned transfer gate 42, and the transfer gate 41 is omitted.

In a case when the first normal clock signal C1 is at the High level, the first inverted clock signal CB1 is at the Low level and the transfer gate 31 transfers the input data to the node NA1. In a case when the second normal clock signal C2 is at the High level, the second inverted clock signal CB1 is at the Low level and the transfer gate 32 transfers the input data to the node NA2. That is to say, only when both of the first normal clock signal C1 and the second normal clock signal C2 are at the High level (the first state), the data input unit 10 transmits the same data to both of the nodes NA1 and NA2.

On the other hand, in the case when at least one of the first normal clock signal C1 and the second normal clock signal C2 is at the Low level (the second state), the input data is transferred to one of the nodes NA1 and NA2 at the very most. At least, the same data is not transmitted to both of the nodes NA1 and NA2. As a result, the data rewriting does not occur in the data retention unit 20.

As described above, the operation similar to that in the fifth embodiment can be achieved even by the configuration shown in FIG. 6. Therefore, the same effects as in the fifth embodiment are obtained. Moreover, the number of elements in the data input unit 10 is decreased and the configuration of the data input unit 10 is simplified, which are additional effects.

7. Seventh Embodiment

Figure 7:
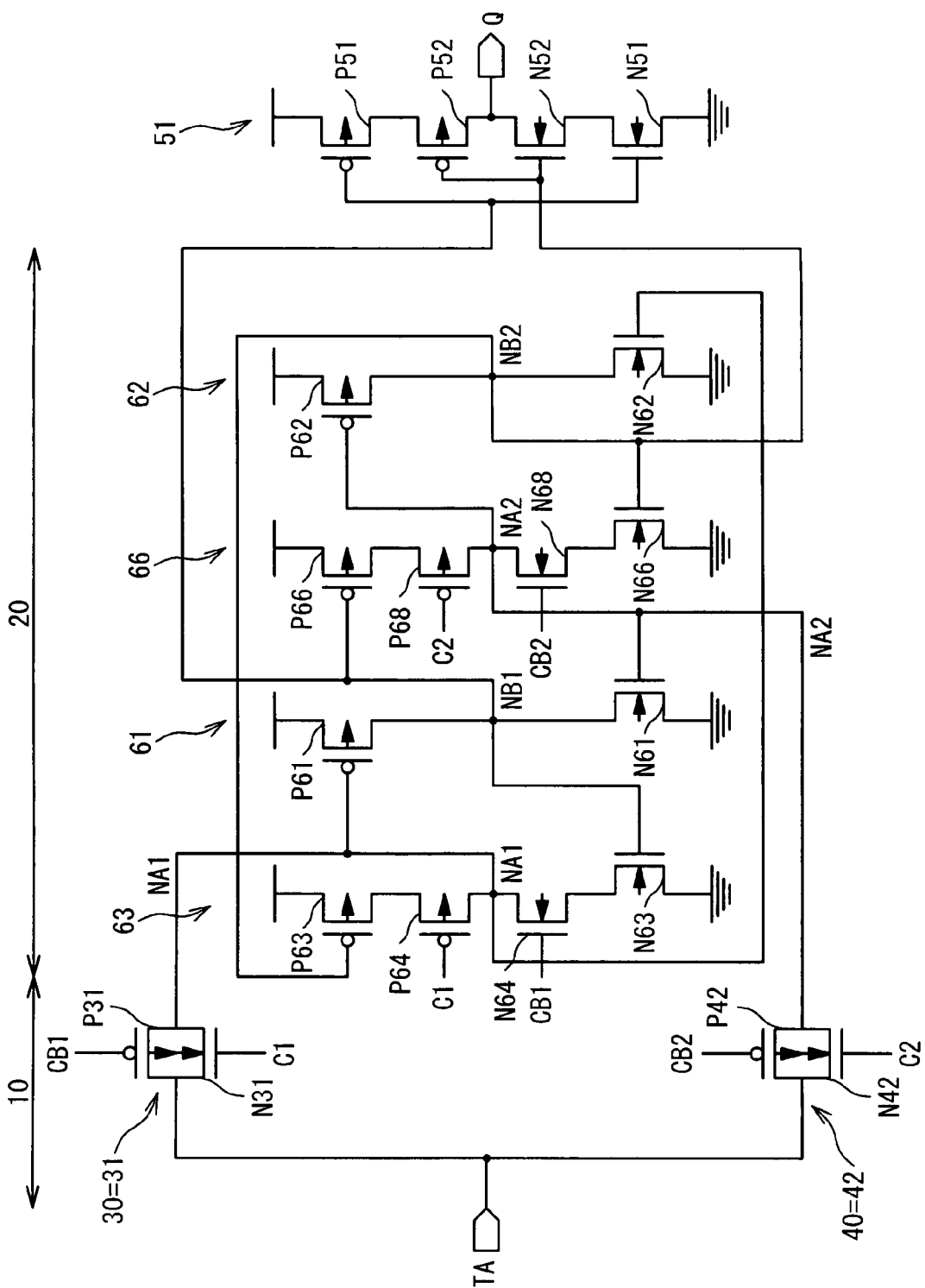
FIG. 7 is a circuit diagram showing a latch circuit according to a seventh embodiment of the present invention.

FIG. 7 is a circuit diagram showing a configuration of a latch circuit according to the seventh embodiment of the present invention. In FIG. 7, the same reference numerals are given to the same components as those in FIG. 6, and an overlapping description will be appropriately omitted. The data input unit 10 in the present embodiment is the same as the data input unit 10 in the sixth embodiment.

In FIG. 7, a configuration of the data retention unit 20 is simplified. More specifically, as compared with the configuration shown in FIG. 6, the Pch-transistor P65 and the Nch-transistor N65 are omitted from the clocked inverter 63 in the data retention unit 20, and the Pch-transistor P67 and the Nch-transistor N67 are omitted from the clocked inverter 66. That is, the clocked inverter 63 is configured to operate on the basis of one clock signal line (C1, CB1). The clocked inverter 66 is configured to operate on the basis of the other clock signal line (C2, CB2).

In the case when both of the first normal clock signal C1 and the second normal clock signal C2 are at the High level (the first state), both of the first inverted clock signal CB1 and the second inverted clock signal CB2 become at the Low level. As a result, both of the clocked inverters 63 and 66 are deactivated, and the feedbacks to the nodes NA1 and NA2 are disabled. At this time, the data input unit 10 transmits the input data to both of the nodes NA1 and NA2, as mentioned above. Therefore, the data at the nodes NA1 and NA2 are rewritten in the data retention unit 20.

In a case when both of the first normal clock signal C1 and the second normal clock signal C2 are at the Low level, both of the first inverted clock signal CB1 and the second inverted clock signal CB2 become at the High level. As a result, both of the clocked inverters 63 and 66 are activated, and the feedbacks to the nodes NA1 and NA2 are enabled. Consequently, the data are held stably at the four nodes NA1, NA2, NB1 and NB2.

Let us consider a case where one of the first normal clock signal C1 and the second normal clock signal C2 is at the High level due to the disturbance caused by the SET. For example, let us consider a case where the first normal clock signal C1 becomes at the High level and the second normal clock signal C2 is kept at the Low level. In this case, the first inverted clock signal CB1 is at the Low level, and the second inverted clock signal CB2 is at the High level. As a result, the clocked inverter 63 is deactivated, and the feedback from the nodes NB1, NB2 to the node NA1 is disabled. At this time, the first data input unit 30 transmits the input data to the node NA1, and the value of the node NA1 is determined by the input data. On the other hand, the clocked inverter 66 is activated, and the feedback from the nodes NB1, NB2 to the node NA2 is enabled. Therefore, the value immediately before is held at the node NA2. As described above, even if the data at any one node is changed transiently for a short time period of the SEU or the SET, the data at the other three nodes are maintained. As a result, the data hold state of the four nodes returns back to the original state.

Next, let us consider a case where the operation of the clocked inverter 63 depends on the other clock signal line (C2, CB2), which is different from the case in FIG. 7. In this case, the feedback from the nodes NB1, NB2 to the node NA1 is enabled, and thus the input data and the feedback data interfere with each other at the node NA1. It is therefore preferable that the clocked inverter 63 is configured to operate on the basis of the clock signal (C1, CB1). In the case where the clocked inverter 63 is configured to operate based on the clock signal (C2, CB2), it is desirable to employ the data input unit 10 in the fifth embodiment (refer to FIG. 5) instead of the data input unit 10 shown in FIG. 7. Consequently, the normal operation is assured.

As described above, the operation similar to that in the sixth embodiment can be achieved even by the configuration shown in FIG. 7. Therefore, the same effects as in the sixth embodiment are obtained. The data input unit 10 in the present embodiment can be the same as the data input unit 10 in the fifth embodiment. In that case, the same effects as in the fifth embodiment are obtained. Furthermore, the number of elements in the data retention unit 20 is decreased and the configuration of the data retention unit 20 is simplified, which are additional effects.

8. Eighth Embodiment

Figure 8:
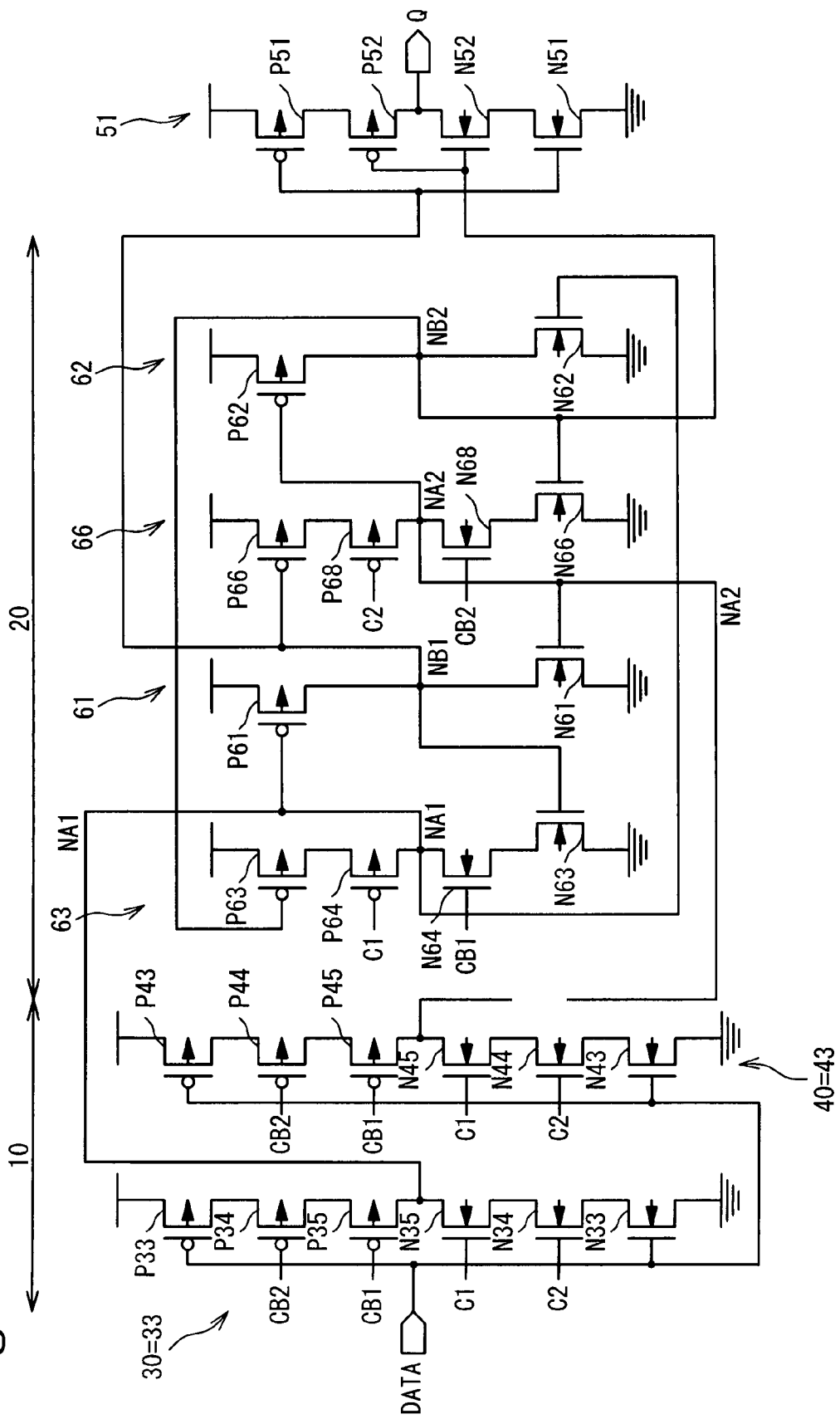
FIG. 8 is a circuit diagram showing a latch circuit according to an eighth embodiment of the present invention.

FIG. 8 is a circuit diagram showing a configuration of a latch circuit according to the eighth embodiment of the present invention. In FIG. 8, the same reference numerals are given to the same components as those in FIG. 7, and an overlapping description will be appropriately omitted. The data retention unit 20 in the present embodiment is the same as the data retention unit 20 in the seventh embodiment.

In FIG. 8, the first data input unit 30 includes a clocked inverter 33 that is connected between the input terminal DATA and the node NA1. The clocked inverter 33 includes Pch-transistors P33 to P35 and Nch-transistors N33 to N35 that are connected in series between the power source and the ground. Gates of the Pch-transistor P33 and the Nch-transistor N33 are connected to the input terminal DATA. Drains of the Pch-transistor P35 and the Nch-transistor N35 are connected to the node NA1. The second inverted clock signal CB2 is input to a gate of the Pch-transistor P34. The first inverted clock signal CB1 is input to a gate of the Pch-transistor P35. The second normal clock signal C2 is input to a gate of the Nch-transistor N34. The first normal clock signal C1 is input to a gate of the Nch-transistor N35. That is to say, the clocked inverter 33 is configured to operate on the basis of the two clock signal lines (C1, CB1) and (C2, CB2).

The second data input unit 40 includes a clocked inverter 43 that is connected between the input terminal DATA and the node NA2. The clocked inverter 43 includes Pch-transistors P43 to P45 and Nch-transistors N43 to N45 that are connected in series between the power source and the ground. Gates of the Pch-transistor P43 and the Nch-transistor N43 are connected to the input terminal DATA. Drains of the Pch-transistor P45 and the Nch-transistor N45 are connected to the node NA2. The second inverted clock signal CB2 is input to a gate of the Pch-transistor P44. The first inverted clock signal CB1 is input to a gate of the Pch-transistor P45. The second normal clock signal C2 is input to a gate of the Nch-transistor N44. The first normal clock signal C1 is input to a gate of the Nch-transistor N45. That is to say, the clocked inverter 43 is configured to operate on the basis of the two clock signal lines (C1, CB1) and (C2, CB2).

In the case when both of the first normal clock signal C1 and the second normal clock signal C2 are at the High level (the first state), the Nch-transistors N34, N35, N44 and N45 are turned on. At the same time, both of the first inverted clock signal CB1 and the second inverted clock signal CB2 become at the Low level, and thus the Pch-transistors P34, P35, P44 and P45 are turned on. As a result, the clocked inverter 33 functions as a simple inverter composed of the Pch-transistor P33 and the Nch-transistor N33, and the first data input unit 30 transmits the inverted data of the input data input to the input terminal DATA to the node NA1. Similarly, the clocked inverter 43 functions as a simple inverter composed of the Pch-transistor P43 and the Nch-transistor N43, and the second data input unit 40 transmits the inverted data of the input data input to the input terminal DATA to the node NA2. Consequently, the data input unit 10 transmits the same data to both of the nodes NA1 and NA2.

In the case when at least one of the first normal clock signal C1 and the second normal clock signal C2 is at the Low level (the second state), at least one of the Nch-transistors N34 and N35 is turned off and at least one of the Nch-transistors N44 and N45 is turned off. At the same time, at least one of the first inverted clock signal CB1 and the second inverted clock signal CB2 becomes at the High level, at least one of the Pch-transistors P34 and P35 is turned off and at least one of the Pch-transistors P44 and P45 is turned off. As a result, the electrical connections between the input terminal DATA and the respective nodes NA1 and NA2 are cut off. That is to say, the data input unit 10 does not transmit the data to the nodes NA1 and NA2.

As described above, the operation similar to that in the seventh embodiment can be achieved even by the configuration shown in FIG. 8. Therefore, the same effects as in the seventh embodiment are obtained. The data retention unit 20 in the present embodiment can be the same as the data retention unit 20 in the fifth embodiment (refer to FIG. 5). In that case, the same effects as in the fifth embodiment are obtained.

Figure 9:
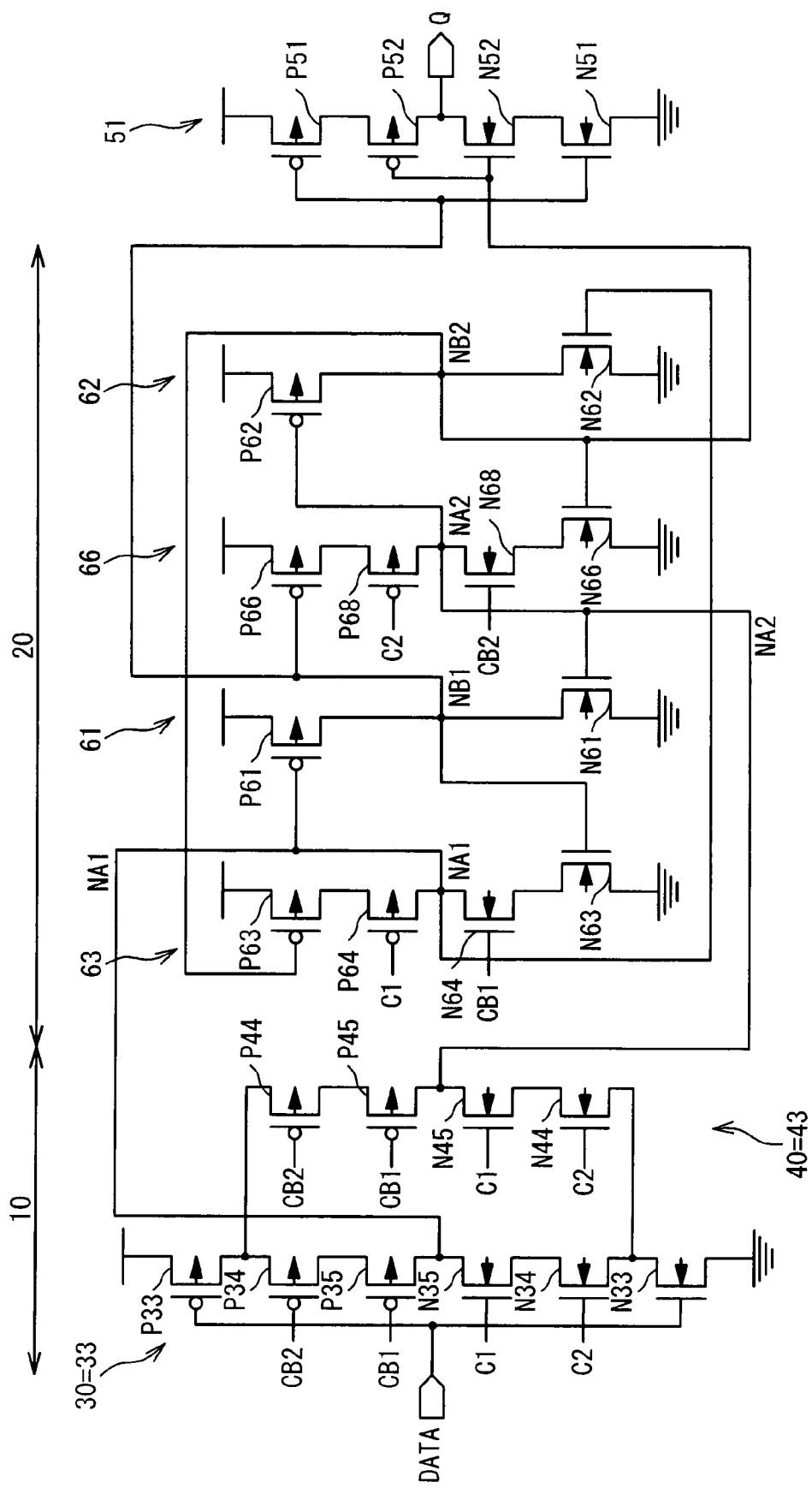
FIG. 9 is a circuit diagram showing another example of the latch circuit according to the eighth embodiment of the present invention.

FIG. 9 shows another example of a latch circuit according to the present embodiment. In FIG. 9, the clocked inverter 33 in the first data input unit 30 and the clocked inverter 43 in the second data input unit 40 use the Pch-transistor P33 and the Nch-transistor N33 in common. In other words, the clocked inverter 43 provided between the input terminal DATA and the node NA2 is composed of the Pch-transistors P33, P44, P45, the Nch-transistors N33, N45 and N44 that are connected in series between the power source and the ground.

As compared with FIG. 8, the Pch-transistor P43 and the Nch-transistor N43 are removed. Since the number of elements in the data input unit 10 is decreased, a circuit area can be reduced, which is an additional effect.

9. Ninth Embodiment

Figure 10:
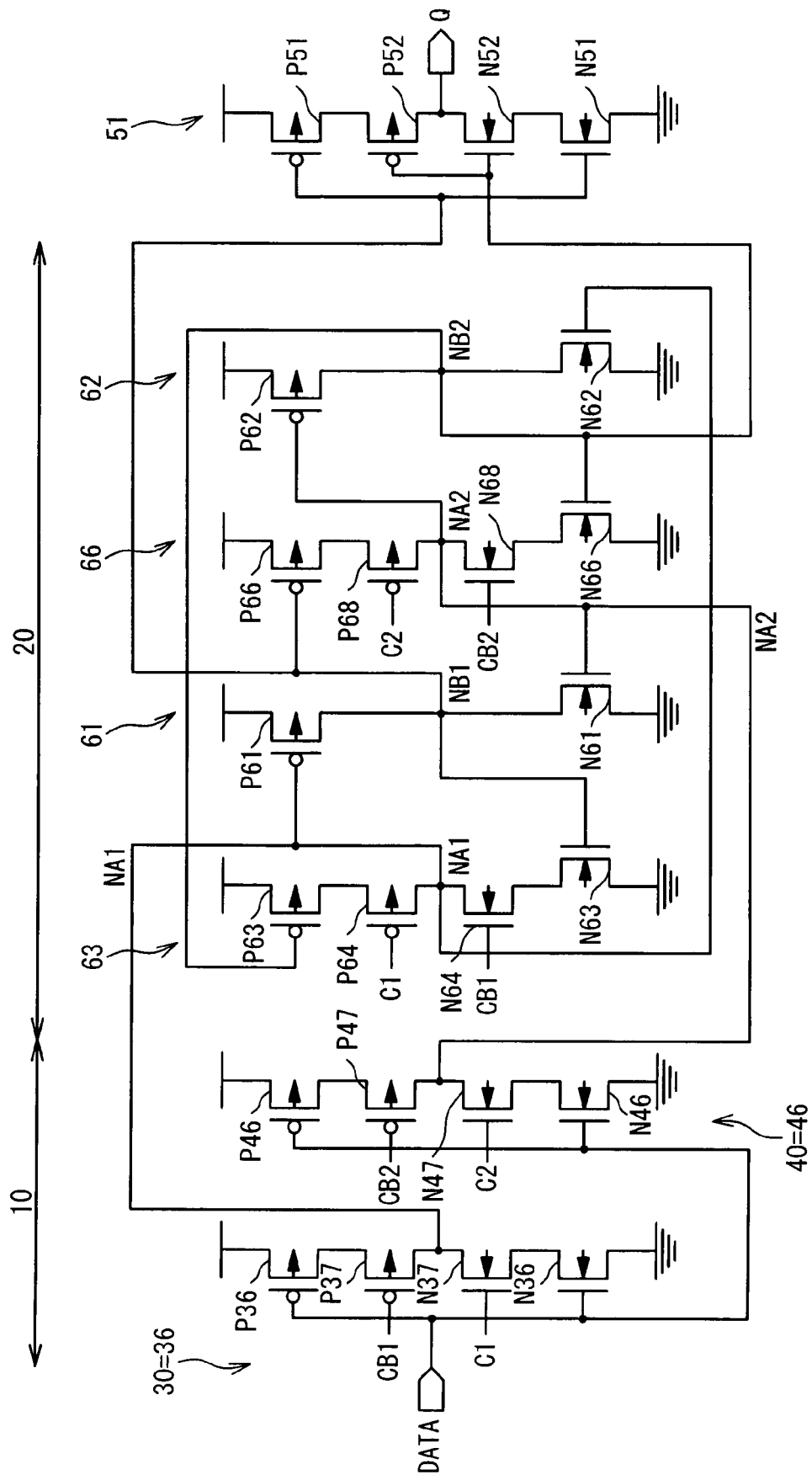
FIG. 10 is a circuit diagram showing a latch circuit according to a ninth embodiment of the present invention.

FIG. 10 is a circuit diagram showing a configuration of a latch circuit according to the ninth embodiment of the present invention. In FIG. 10, the same reference numerals are given to the same components as those in FIG. 8, and an overlapping description will be appropriately omitted. The data retention unit 20 in the present embodiment is the same as the data retention unit 20 in the eighth embodiment. It should be noted that the data retention unit 20 in the present embodiment can be the same as the data retention unit 20 in the fifth embodiment or the sixth embodiment.

Since the SEU tolerance is enhanced in the data retention unit 20 as described above, the data input unit 10 needs to supply the same data simultaneously to both of the nodes NA1 and NA2 in order to carry out the data writing. As explained in the sixth embodiment, the data input unit 10 can be simplified by utilizing such the characteristics (see FIG. 6). Such the characteristic is also utilized in the present embodiment, and thereby the configuration of the data input unit 10 is simplified as compared with the eighth embodiment.

In FIG. 10, the first data input unit 30 includes a clocked inverter 36 that is connected between the input terminal DATA and the node NA1. The clocked inverter 36 includes Pch-transistors P36, P37, Nch-transistors N37 and N36 that are connected in series between the power source and the ground. Gates of the Pch-transistor P36 and the Nch-transistor N36 are connected to the input terminal DATA. Drains of the Pch-transistor P37 and the Nch-transistor N37 are connected to the node NA1. The first inverted clock signal CB1 is input to a gate of the Pch-transistor P37. The first normal clock signal C1 is input to a gate of the Nch-transistor N37. That is to say, the clocked inverter 36 is configured to operate on the basis of one clock signal line (C1, CB1).

The second data input unit 40 includes a clocked inverter 46 that is connected between the input terminal DATA and the node NA2. The clocked inverter 46 includes Pch-transistors P46, P47, Nch-transistors N47 and N46 that are connected in series between the power source and the ground. Gates of the Pch-transistor P46 and the Nch-transistor N46 are connected to the input terminal DATA. Drains of the Pch-transistor P47 and the Nch-transistor N47 are connected to the node NA2. The second inverted clock signal CB2 is input to a gate of the Pch-transistor P47. The second normal clock signal C2 is input to a gate of the Nch-transistor N47. That is to say, the clocked inverter 46 is configured to operate on the basis of the other clock signal line (C2, CB2).

In the case when both of the first normal clock signal C1 and the second normal clock signal C2 are at the High level (the first state), the data input unit 10 transmits the same data to both of the nodes NA1 and NA2. Therefore, the data is rewritten normally. On the other hand, in the case when at least one of the first normal clock signal C1 and the second normal clock signal C2 is at the Low level (the second state), the inverted data of the input data is transmitted to one of the nodes NA1 and NA2 at the very most. At least, the same data is not transmitted to both of the nodes NA1 and NA2. As a result, the data rewriting does not occur in the data retention unit 20.

As described above, the operation similar to that in the eighth embodiment can be achieved even by the configuration shown in FIG. 10. Therefore, the same effects as in the eighth embodiment are obtained. The data retention unit 20 in the present embodiment can be the same as the data retention unit 20 in the fifth embodiment. In that case, the same effects as the fifth embodiment are obtained. Furthermore, the number of elements in the data input unit 10 is decreased and the configuration of the data input unit 10 is simplified, which are additional effects.

Figure 11:
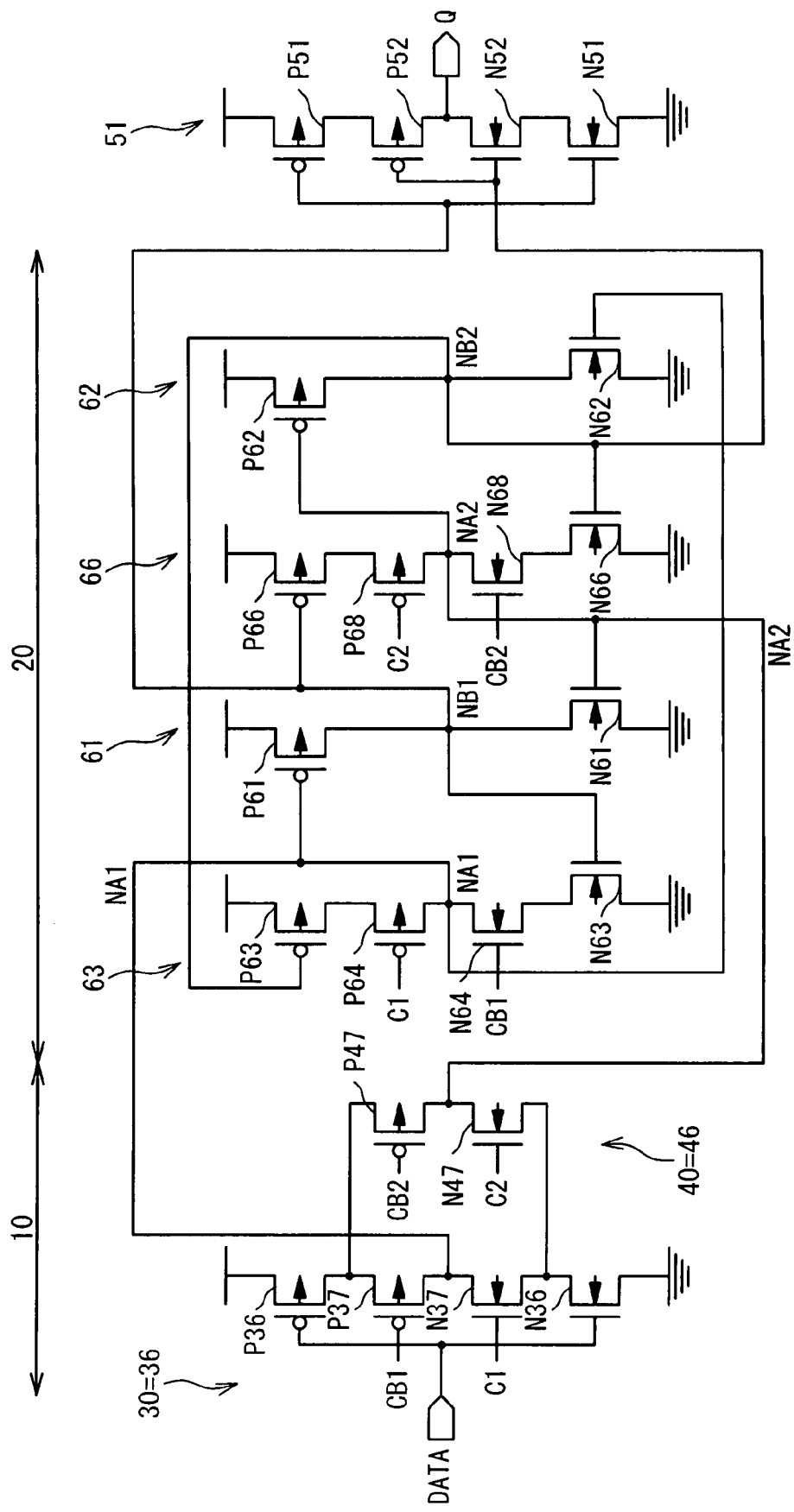
FIG. 11 is a circuit diagram showing another example of the latch circuit according to the ninth embodiment of the present invention.

FIG. 11 shows another example of a latch circuit according to the present embodiment. In FIG. 11, the clocked inverter 36 in the first data input unit 30 and the clocked inverter 46 in the second data input unit 40 use the Pch-transistor P36 and the Nch-transistor N36 in common. In other words, the clocked inverter 46 provided between the input terminal DATA and the node NA2 is composed of the Pch-transistors P36, P47, the Nch-transistors N47 and N36 that are connected in series between the power source and the ground.

As compared with FIG. 10, the Pch-transistor P46 and the Nch-transistor N46 are removed. Since the number of elements in the data input unit 10 is decreased, a circuit area can be reduced, which is an additional effect.

10. Clock Signal

Figure 12:
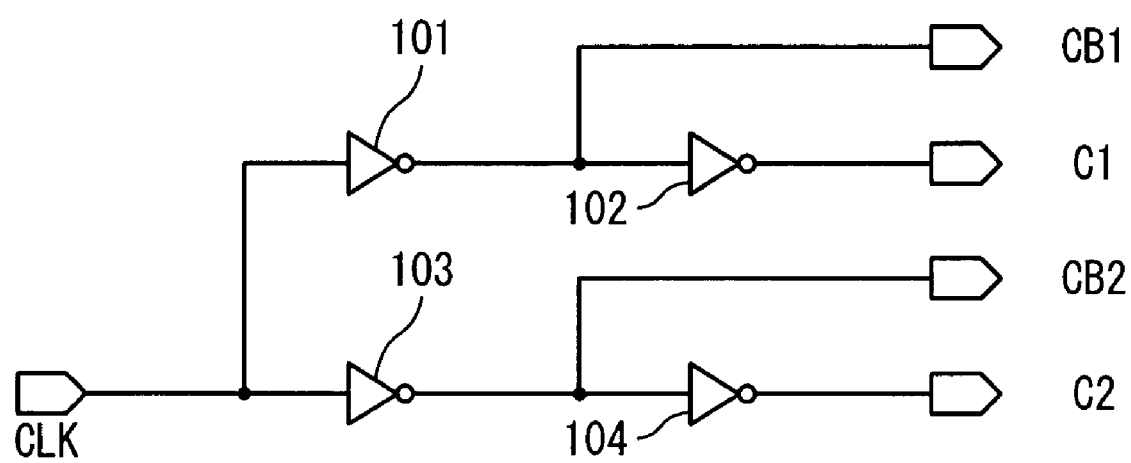
FIG. 12 is a circuit diagram showing a clock signal generation circuit according to the embodiments of the present invention.

FIG. 12 shows one example of a clock signal generation circuit for generating the above-mentioned clock signals C1, CB1, C2 and CB2. The clock signal generation circuit is placed in the vicinity of the latch circuit. In FIG. 12, the clock signals C1, CB1, C2 and CB2 are generated based on one global clock signal CLK.

More specifically, the global clock signal CLK is input to inverters 101 and 103. An output of the inverter 101 is input to an inverter 102. An output of the inverter 103 is input to an inverter 104. The first inverted clock signal CB1 is driven by the inverter 101. The first normal clock signal C1 is driven by the inverter 102. The second inverted clock signal CB2 is driven by the inverter 103. The second normal clock signal C2 is driven by the inverter 104. The first normal clock signal C1 and the second normal clock signal C2 change in synchronization with the global clock signal CLK and have the same phase as that of the global clock signal CLK. The first inverted clock signal CB1 and the second inverted clock signal CB2 are the inverted signals of the global clock signal CLK.

In order to reduce probability that the SET-induced disturbance occurs simultaneously in the first normal clock signal C1 and the second normal clock signal C2, it is preferable to form the inverter 102 and the inverter 104 at distant positions. It is desirable to determine a layout such that at least a drain of a MOS transistor of the inverter 102 is not adjacent to a drain of a MOS transistor of the inverter 104. Similarly, in order to reduce probability that the SET-induced disturbance occurs simultaneously in the first inverted clock signal CB1 and the second inverted clock signal CB2, it is preferable to form the inverter 101 and the inverter 103 at distant positions. It is desirable to determine a layout such that at least a drain of a MOS transistor of the inverter 101 is not adjacent to a drain of a MOS transistor of the inverter 103.

Figure 13:
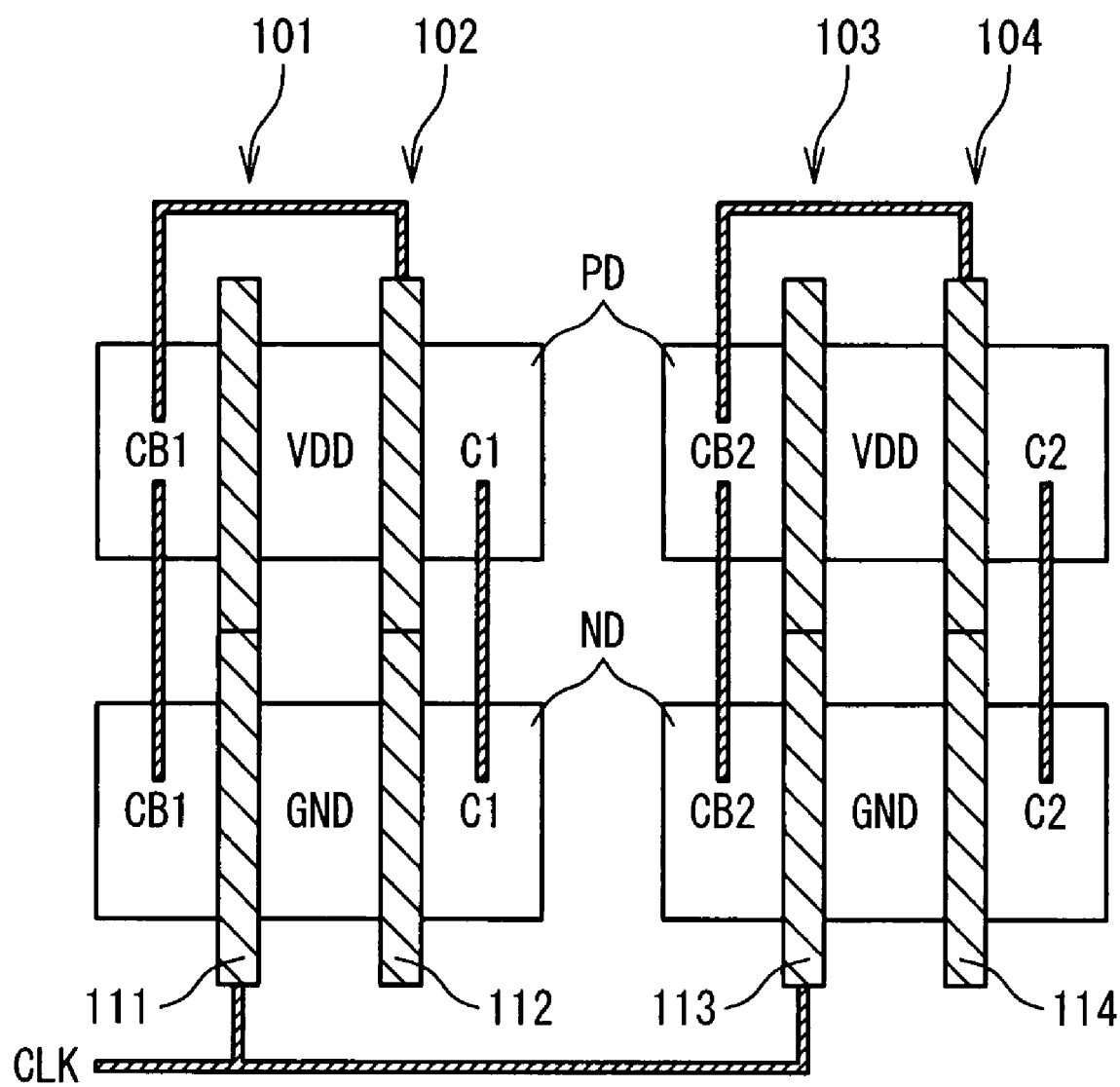
FIG. 13 is a plan view showing one example of a layout of the clock signal generation circuit according to the embodiments of the present invention.

FIG. 13 shows one example of such a preferable layout. In FIG. 13, the inverters 101 to 104 are formed on a semiconductor substrate. Each inverter (101, 102, 103 or 104) has a Pch-transistor and an Nch-transistor. In each inverter (101, 102, 103 or 104), gate electrodes (111, 112, 113 or 114) of the Pch-transistor and the Nch-transistor are formed in common. Each Pch-transistor has a P-type diffusion layer PD serving as source/drain. Each Nch-transistor has an N-type diffusion layer ND serving as source/drain.

The diffusion layers PD and ND serving as the sources in the inverter 101 and the diffusion layers PD and ND serving as the sources in the inverter 102 are formed in common, respectively. Similarly, the diffusion layers PD and ND serving as the sources in the inverter 103 and the diffusion layers PD and ND serving as the sources in the inverter 104 are formed in common, respectively. The diffusion layers PD and ND serving as the drains in the inverter 101 are connected to the gate electrode 112 of the inverter 102. Similarly, the diffusion layers PD and ND serving as the drains in the inverter 103 are connected to the gate electrode 114 of the inverter 104. The global clock signal CLK is input to the gate electrode 111 of the inverter 101 and the gate electrode 113 of the inverter 103.

As shown in FIG. 13, the inverters 101, 102, 103 and 104 are so formed as to align in this order. Consequently, separation between the inverter 101 and the inverter 103 and separation between the inverter 102 and the inverter 104 are achieved with the space saved. Thus, the probability that the SET-induced disturbance occurs simultaneously in the first normal clock signal C1 and the second normal clock signal C2 is reduced. Also, the probability that the SET-induced disturbance occurs simultaneously in the first inverted clock signal CB1 and the second inverted clock signal CB2 is reduced. Even if the SET-induced disturbance occurs, it is likely to be limited to any one clock signal line. As described in the foregoing embodiments, if the disturbance is limited to one clock signal line, it does not affect the operation of the latch circuit. As a result of the layout shown in FIG. 13, the tolerance of the latch circuit to the SET of the clock signal is further improved.

Figure 14:
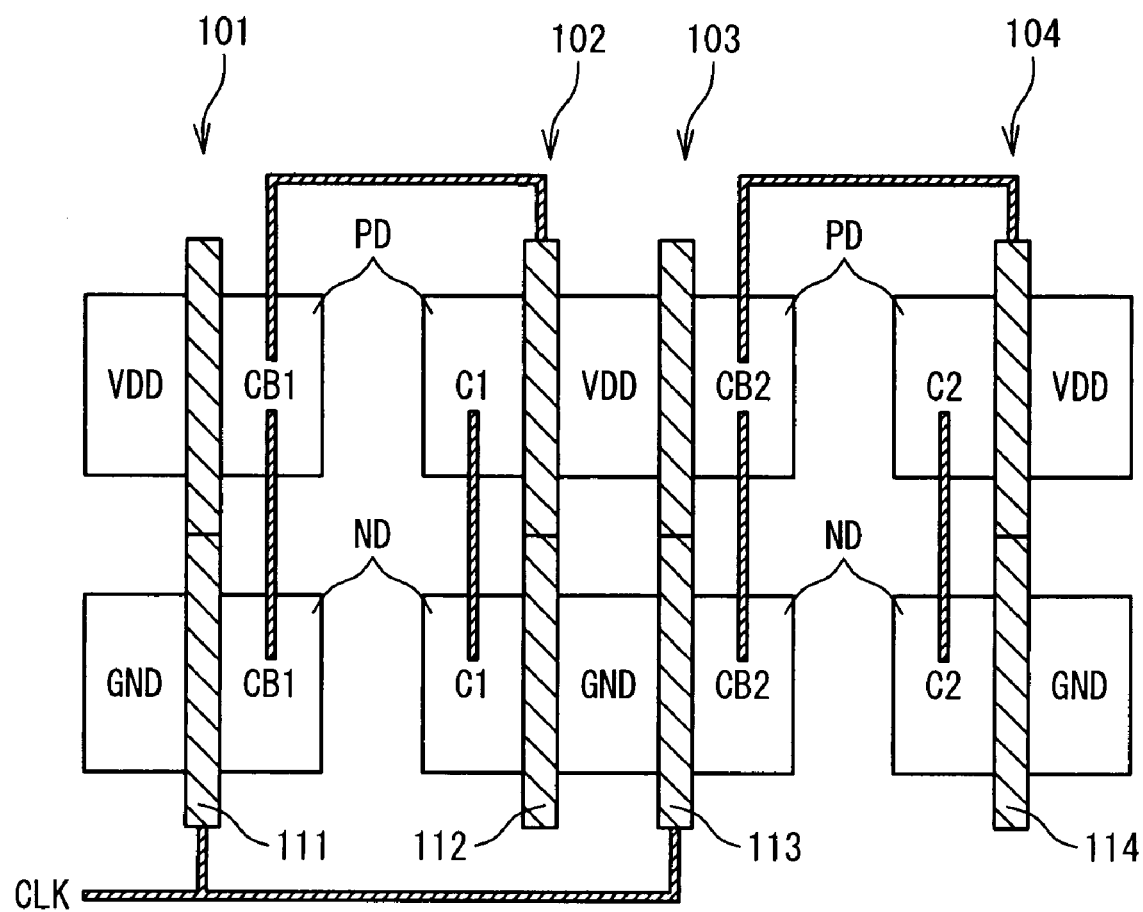
FIG. 14 is a plan view showing another example of a layout of the clock signal generation circuit according to the embodiments of the present invention.

FIG. 14 shows another example of the preferable layout. The diffusion layers PD and ND serving as the sources in the inverter 102 and the diffusion layers PD and ND serving as the sources in the inverter 103 are formed in common, respectively. Also in FIG. 14, the inverters 101, 102, 103 and 104 are so formed as to align in this order. Thus, the separation between the inverter 101 and the inverter 103 and the separation between the inverter 102 and the inverter 104 are achieved with the space saved. As a result, the tolerance of the latch circuit to the SET of the clock signal is further improved.

It is apparent that the present invention is not limited to the above embodiments and may be modified and changed without departing from the scope and spirit of the invention.

What is claimed is:

1. A latch circuit, comprising:
a data input unit to which input data is input, said data input unit comprising:
 a first data input unit having a first data input unit output; and
 a second data input unit having a second data input unit output; and
a data retention unit comprising:
 a first node connected to said first data input unit output;
 a second node connected to said second data input unit output;
 a third node at which an inverted data of data at said first node appears; and
 a fourth node at which inverted data of data at said second node appears,
wherein said first data input unit and said second data input unit transmit data depending on said input data to said first node and said second node when both of a first clock signal and a second clock signal are at a first level,
wherein both of said first clock signal and said second clock signal are driven independently from each other, and
wherein said data retention unit holds said data when at least one of said first clock signal and said second clock signal is at a second level that is an inverted level of said first level.

2. The latch circuit according to claim 1, wherein said first clock signal includes:
a first normal clock signal whose phase is equal to that of a clock signal; and
a first inverted clock signal that is an inverted signal of said first normal clock signal, wherein said second clock signal includes:
 a first normal clock signal whose phase is equal to that of said clock signal; and
 a second inverted clock signal that is an inverted signal of said second normal clock signal.

3. The latch circuit according to claim 2, wherein said first inverted clock signal is driven by a first clock-driving inverter, said first normal clock signal is driven by a second clock-driving inverter, said second inverted clock signal is driven by a third clock-driving inverter, and said second normal clock signal is driven by a fourth clock-driving inverter,
wherein said first clock-driving inverter, said second clock-driving inverter, said third clock-driving inverter and said fourth clock-driving inverter are so formed on a semiconductor substrate as to align in this order.

4. The latch circuit according to claim 1, wherein said first clock signal occurs simultaneously in synchronization with the second clock signal.

5. The latch circuit according to claim 1, wherein a phase of the first clock signal is equal to a phase of the second clock signal.

6. A data retention circuit, comprising:
an input unit to receive input data;
a first clock inverter configured to invert a first clock signal;
a second clock inverter configured to invert a second clock signal, the second clock signal being driven independently of the first clock signal; and
a data retention unit comprising:
 a first node connected to a first output of said data input unit;
 a second node connected to a second output of said data input unit;
 a third node at which inverted data of data at said first node appears; and
 a fourth node at which inverted data of data at said second node appears,
wherein the input data is transmitted to the first node and the second node when both of the first clock signal and the second clock signal are at a first level in a first state, and said data retention unit feeds back said inverted data from both of said third node and said fourth node to rewrite the first node and second node when at least one of said first clock signal and said second clock signal is at a second level that is an inverted level of said first level in a second state.

7. A latch circuit, comprising:
a data input terminal to provide data to a first node and a second node;
a data output unit associated with a third node and a fourth node;
a first inverter connected between the first node, the second node, and the third node, the first inverter transmitting inverted data of data at the first node and the second node to the third node;
a second inverter connected between the first node, the second node, and the fourth node, the second inverter transmitting an inverted data of the data at the first node and the second node to the fourth node;
a first clock inverter configured to operate on a basis of a first clock signal line, the first clock inverter being provided between the first node, the second node, and the third node, and an inverted data of the data at the third node and the fourth node appears at the first node; and
a second clock inverter configured to operate on a basis of a second clock signal line, the second clock inverter being provided between the first node, the second node, and the fourth node, and inverted data of the data at the third node and the fourth node appears at the second node.

8. The latch circuit according to claim 7, wherein, when both of a first normal clock signal provided to the first clock signal line and a second normal clock signal provided to the second clock signal line are at a high level, and a first inverted clock signal from the first clock inverter and a second inverted clock signal from the second clock inverter are at a low level, feedbacks to the first and second nodes are disabled.

9. The latch circuit according to claim 7, wherein, when both a first normal clock signal provided to the first clock signal line and a second normal clock signal provided to the second clock signal line are at a low level, a first inverted clock signal from the first clock inverter and a second inverted clock signal from the second clock inverter are at a high level, and feedbacks to the first and second nodes are enabled.

10. The latch circuit according to claim 7, wherein, when one of a first normal clock signal provided to the first clock signal line and a second normal clock signal provided to the second clock signal line is at a high level, one of the first clock inverter and the second clock inverter is deactivated, and feedbacks from the first and second nodes to a respective one of the third and fourth nodes are disabled.

* * * * *